US010126397B2

(12) United States Patent
Cauley et al.

(10) Patent No.: US 10,126,397 B2
(45) Date of Patent: Nov. 13, 2018

(54) SYSTEMS AND METHODS FOR FAST MAGNETIC RESONANCE IMAGE RECONSTRUCTION USING A HEIRARCHICALLY SEMISEPARABLE SOLVER

(71) Applicants: Stephen Cauley, Cambridge, MA (US); Berkin Bilgic, Boston, MA (US); Kawin Setsompop, Cambridge, MA (US); Lawrence Wald, Cambridge, MA (US)

(72) Inventors: Stephen Cauley, Cambridge, MA (US); Berkin Bilgic, Boston, MA (US); Kawin Setsompop, Cambridge, MA (US); Lawrence Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 589 days.

(21) Appl. No.: 14/707,598

(22) Filed: May 8, 2015

(65) Prior Publication Data
US 2015/0323633 A1 Nov. 12, 2015

Related U.S. Application Data

(60) Provisional application No. 61/990,921, filed on May 9, 2014.

(51) Int. Cl.
| | |
|---|---|
| *G01R 33/56* | (2006.01) |
| *G01R 33/561* | (2006.01) |
| *G01R 33/385* | (2006.01) |
| *G01R 33/567* | (2006.01) |

(52) U.S. Cl.
CPC ....... *G01R 33/5608* (2013.01); *G01R 33/385* (2013.01); *G01R 33/5615* (2013.01); *G01R 33/5673* (2013.01); *G01R 33/5611* (2013.01)

(58) Field of Classification Search
CPC ............ G01R 33/5608; G01R 33/5615; G01R 33/385; G01R 33/5673; G01R 33/5611
USPC ......................................... 324/248, 307, 309
See application file for complete search history.

(56) References Cited

U.S. PATENT DOCUMENTS

| | | | | |
|---|---|---|---|---|
| 2011/0254549 | A1* | 10/2011 | Lin ................... | G01R 33/5611 324/309 |
| 2013/0188856 | A1* | 7/2013 | Adler, Jr. ................ | A61B 6/12 382/132 |

OTHER PUBLICATIONS

Sheng et al. (Algorithms to Solve Hierarchically Semi-separable systems; advances and applications, vol. 176, 255-294, 2007).*

* cited by examiner

*Primary Examiner* — Farhana Hoque
(74) *Attorney, Agent, or Firm* — Quarles & Brady LLP

(57) ABSTRACT

Systems and methods for reconstructing images using a hierarchically semiseparable ("HSS") solver to compactly represent the inverse encoding matrix used in the reconstruction are provided. The reconstruction method includes solving for the actual inverse of the encoding matrix using a direct (i.e., non-iterative) HSS solver. This approach is contrary to conventional reconstruction methods that repetitively evaluate forward models (e.g., compressed sensing or parallel imaging forward models).

9 Claims, 4 Drawing Sheets

SYSTEMS AND METHODS FOR FAST MAGNETIC RESONANCE IMAGE RECONSTRUCTION USING A HEIRARCHICALLY SEMISEPARABLE SOLVER

CROSS-REFERENCE TO RELATED APPLICATIONS

This application claims the benefit of U.S. Provisional Patent Application Ser. No. 61/990,921, filed on May 9, 2014, and entitled "SYSTEMS AND METHODS FOR FAST MAGNETIC RESONANCE IMAGE RECONSTRUCTION USING A HEIRARCHICALLY SEMISEPARABLE SOLVER."

STATEMENT REGARDING FEDERALLY SPONSORED RESEARCH

This invention was made with government support under EB012107 and MH093765 awarded by the National Institutes of Health. The government has certain rights in the invention.

BACKGROUND OF THE INVENTION

In clinical applications of structural magnetic resonance imaging (MRI), there exists a multi-objective trade-off between image quality, imaging time, and reconstruction time. Reducing imaging time for a given protocol is clearly beneficial from a cost prospective, and can also facilitate more detailed studies with the same patient throughput. Image quality tends to be a firm barrier placed by radiologists or researchers based upon requirements for data analysis. Finally, stringent hardware limitations exist for clinical FDA approved scanners. It is important to note that advances in MRI sequences and hardware continue to increase the computational burden for image reconstruction, e.g. large coil arrays, increased resolution, and multi-contrast studies. In this work, we investigate a highly scalable inverse algorithm intended to ameliorate the computational challenges associated with accurate compressed sensing (CS) reconstruction.

Sparse signal reconstruction has been introduced for MRI as a method to improve imaging time through random under-sampling of k-space. By assuming a sparsity inducing L1 image prior, the reconstruction problem can be formulated as an unconstrained optimization problem. This problem incorporates fidelity against the observed k-space samples with a penalty imposed on the sparsity prior. These methods have been shown to provide good image accuracy, but can significantly increase the computational burden for image reconstruction. This is especially evident with the inclusion of parallel imaging techniques (e.g., SENSE, GRAPPA, L1-Spirit). Several attempts have been made to reduce the computational requirements associated with sparse signal reconstruction. These iterative techniques rely on repetitive evaluation of forward CS parallel imaging models, however, and thus still have a computational burden.

SUMMARY OF THE INVENTION

The present invention overcomes the aforementioned drawbacks by providing a method for reconstructing an image of a subject from data acquired using a magnetic resonance imaging (MRI) system, in which data acquired from a subject using the MRI system is provided and an inverse of an encoding matrix is computed using a hierarchically semiseparable solver. An image of the subject is then reconstructed from the provided data using the computed inverse of the encoding matrix.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for reconstructing images using a hierarchically semiseparable ("HSS") solver to compactly represent the inverse encoding matrix used in the reconstruction. The reconstruction method described here thus includes solving for the actual inverse of the encoding matrix using a direct (i.e., non-iterative) HSS solver. This approach is contrary to conventional reconstruction methods that repetitively evaluate forward models (e.g., compressed sensing or parallel imaging forward models). The methods described here are capable of achieving a linear computational scaling with respect to the size of the system being solved.

Specifically, the HSS-Inverse described here scales efficiently with the number of imaging voxels and minimizes the influence of the acceleration factor and the number of parallel imaging channels toward the reconstruction time. This technique is therefore capable of achieving upwards of a six-fold speedup over iterative methods, even when those iterative methods take advantage of state-of-the-art preconditioning and coil compression techniques.

The adoption of compressed sensing ("CS") for clinical MRI hinges on the ability to accurately reconstruct images from an undersampled dataset in a reasonable time frame. When CS is combined with SENSE parallel imaging, reconstruction can be computationally intensive. Rather than solving the resulting linear system repetitively with a conjugate gradient ("CG") type method, the HSS-Inverse approach described here solves for the actual inverse of the encoding matrix. The proposed HSS inverse model allows for a greater than six-fold speed-up when compared to current state-of-the-art reconstruction methods, as mentioned above, and should enable real-time CS reconstruction on standard MRI vendors' computational hardware.

Figure 1:
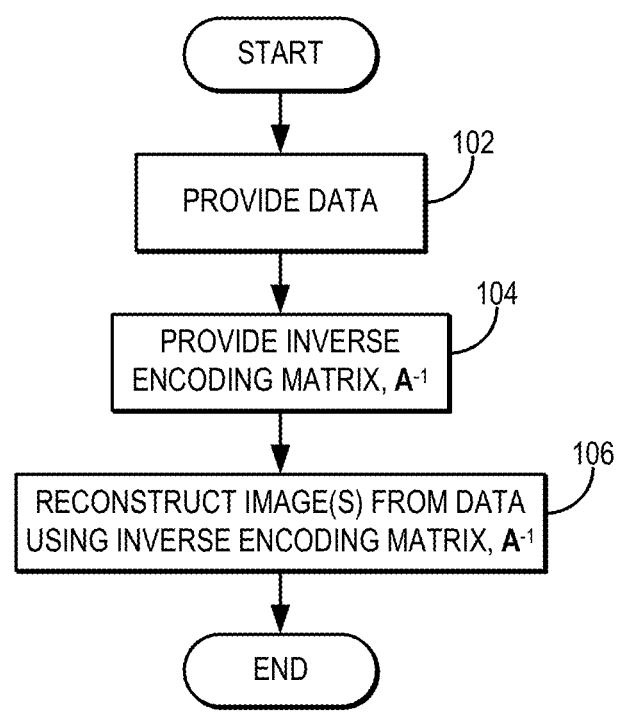
FIG. 1 is a flowchart setting forth the steps of an example method for using a hierarchically semiseparable ("HSS") solver to compute an inverse encoding matrix for use in fast image reconstruction.

Referring now to FIG. 1, a flowchart setting forth the steps of an example method for reconstructing images from data acquired with an MRI system using a fast compressed sensing algorithm that implements an HSS solver is illustrated. The method begins by providing data, from which an image is to be reconstructed, as indicated at step 102. This data can be provided by retrieving previously acquired data from storage, or may be provided by acquiring the data from a subject using an MRI system.

As indicated at step 104, the image reconstruction process includes computing, or otherwise generating, the inverse of an encoding matrix, A, by using an HSS solver to compute a compact representation for the inverse operator, $A^{-1}$, which is the inverse of the encoding matrix, A. As an example, the inverse operator can be computed by performing a structured factorization of the encoding matrix, A, into lower diagonal, L, and diagonal, D, components, $$A = LDL^H \tag{1}$$

Here, many of the terms in the lower diagonal matrix, L, can be easily inverted or can be represented using low-rank modeling. The low-rank properties of the lower diagonal matrix can allow for efficient evaluation of the inverse model.

It is worth noting that the computation of the inverse operator is independent of the acquired, or otherwise provided, data and thus the inverse operator can be pre-computed. By using a pre-computed inverse operator, the total reconstruction time can be significantly reduced. It is also worth noting that the computation of the inverse operator, $A^{-1}$, has minimal dependency on the number of parallel imaging channels, or on the acceleration factor. It will be appreciated by those skilled in the art that the HSS solver used to compute the inverse operator can be readily made parallel for improved performance.

After the inverse operator has been computed, or otherwise provided, the image reconstruction proceeds, as indicated at step 106. In some embodiments, the image reconstruction process is based on a compressed sensing reconstruction. As one example, the image reconstruction can include using Split Bregman ("SB") reconstructions, which may also incorporate compressed sensing, SENSE, or other, parallel imaging techniques.

CS reconstructions generally involve solving an inverse problem in order to match an observed subset of data under an assumed sparsity prior. As an example, images obtained with magnetic resonance imaging ("MRI") can be assumed to be sparse or compressible under a total variation ("TV") transformation, a wavelet transformation, or both.

Generally speaking, the CS formulation for MRI is an unconstrained optimization problem that involves penalty terms based upon assumed TV and wavelet sparsity. By pre-defining penalty weights $\alpha$ and $\gamma$, an example CS optimization can estimate the true image, $x \in \mathbb{C}^N$, as, $$\hat{x} = \operatorname*{argmin}_{x} \|F_\Omega x - y\|_2^2 + \alpha \|\psi^T x\|_1 + \gamma TV(x); \tag{2}$$

where, $F_\Omega \in \mathbb{C}^{M \times N}$ is the undersampled Fourier operator that transforms the image, x, into k-space to match the observations, $y \in \mathbb{C}^M$; $\psi^T$ is the wavelet transform that is applied to the image, x; and TV (x) is the total variation norm of the image, x. In this example, the acceleration factor is R=N/M.

In Eqn. (2), the data fidelity is measured using the $L_2$ metric to represent RMSE against the observations, and the $L_1$ metric is used to promote sparsity in the wavelet transform domain. The TV operator computes a finite difference across the image, x, to promote sparsity in this spatial smoothness domain. In the examples provided below, a more general parallel imaging problem is focused on and, for ease of illustration, only TV sparsity is considered. It will be appreciated by those skilled in the art, however, that other sparsity can be considered, such as sparsity in the wavelet transform domain, as noted above.

By introducing complex coil sensitivity profiles $\{C_i\}_{i=1,\kappa}$, the SENSE parallel imaging model can be incorporated into the CS formulation as follows:

$$\hat{x} = \operatorname*{argmin}_{x} \sum_{i=1}^{K} \|F_\Omega C_i x - y_i\|_2^2 + \gamma(\|G_v x\|_1 + \|G_h x\|_1). \tag{3}$$

In Eqn. (3), the TV operator has been re-written as a sum of horizontal and vertical finite difference operators, $G_h$ and $G_v$. The SB approach relaxes the $L_1$ penalties through the iterative construction of $L_2$ targets:

$$\hat{x} = \operatorname*{argmin}_{x} \sum_{i=1}^{K} \|F_\Omega C_i x - y_i\|_2^2 + \beta(\|G_v x - g_v\|_2^2 + \|G_h x - g_h\|_2^2). \tag{4}$$

By way of example, the targets, $g_v$ and $g_h$, can be updated using a soft thresholding truncation parameter, $\varepsilon$. For example, the following update can be implemented:

$$g_v \leftarrow \max\left(|G_v x| - \frac{\varepsilon}{2}, 0\right) \operatorname{sgn}(G_v x). \tag{5}$$

This operation is linear-time and, thus, the computational cost is dependent on the quadratic minimization shown in Eqn. (4). The explicit solution of this minimization problem is, $$\left[\underbrace{\sum_{i=1}^{K} C_i^H F_\Omega^H F_\Omega C_i}_{T_F} + \beta \underbrace{(G_v^H G_v + G_h^H G_h)}_{T_S}\right] x = \underbrace{\sum_{i=1}^{K} C_i^H F_\Omega^H y_i + G_v^H g_v + G_h^H g_h;}_{b} \tag{6}$$

where $T_F$ is the Fourier operator that has been combined with the Laplacian operator, $T_S$. The inverse problem can thus be referred to as the solution of, $$\underbrace{(T_F + \beta T_S)}_{A} x = b; \tag{7}$$

or as evaluating, $$x = A^{-1} b \tag{8}$$

It is important to note that $T_F$, $T_S$, and the parameter, $\beta$, are constant with respect to the SB iteration and only depend on the protocol and coil sensitivity maps.

The main computational burden for SB is the repeated solution of Eqn. (6). This computation occurs during updates to the gradients targets, $g_h$ and $g_v$, which change b. The constant forward model is represented by the encoding matrix, A. Often times, Eqn. (6) is solved using a Jacobi pre-conditioned conjugate gradient method; however, a compact representation for the SB model inverse, $A^{-1}$, can be computed using an HSS solver, as described above with respect to step 104, and this inverse operator, $A^{-1}$, can be used to efficiently solve Eqn. (6).

In the following examples, the performance of the HSS-Inverse method was compared against several CG-based approaches to highlight the computational trade-offs for reconstruction. The computational scaling for all approaches was analyzed with respect to the image size and the number of parallel imaging channels. The image accuracy for all methods was computed as RMSE against the complex coil combined images from the fully sampled data. Therefore, the results include computational aspects for the algorithms and analysis of the methods using the acquired data. Exhaustive sweeps of TV and soft-thresholding parameters were performed for "best case" accuracy. As both the CG and HSS solvers have controllable accuracy, a typical $10^{-6}$ criteria was used for all methods to ensure consistent results across the reconstructions.

In order to accurately compare the different CS approaches, multi-contrast in vivo data were acquired from a healthy volunteer subject to institutionally approved protocol consent. The data were acquired on a 3T MRI system with a 32-channel head array coil. T2-weighted and Fluid Attenuated Inversion Recovery ("FLAIR") images were acquired with a 224×224 mm² FOV, across 35 slices with a 30% distance factor. The T2-weighted scan uses a Turbo Spin Echo ("TSE") sequence with imaging parameters TR=6.1 s, TE=98 ms, flip angle=150 degrees, and a resolution of 0.5×0.5×3.0 mm³, with a matrix size of 448×448.

The FLAIR scan used a TSE sequence with an inversion pulse and imaging parameters TR=9.0 s, TE=90 ms, TI=2.5 s, flip angle=150 degrees, and a resolution of 0.9×0.9×3.0 mm³, with a matrix size of 256×256. The fully sampled uncombined complex k-space data were retrospectively under-sampled for all computational experiments. In order to examine the computational scaling of the CS reconstruction algorithms, data sets of consistent size were generated across the multiple imaging contrasts. Where applicable, matrix sizes of 112×112, 168×168, 224×224, and 280×280 were constructed by down-sampling the coil data. These images were utilized to represent resolutions of 0.8, 1.0, 1.33, and 2.0 mm for the same FOV.

Figure 2:
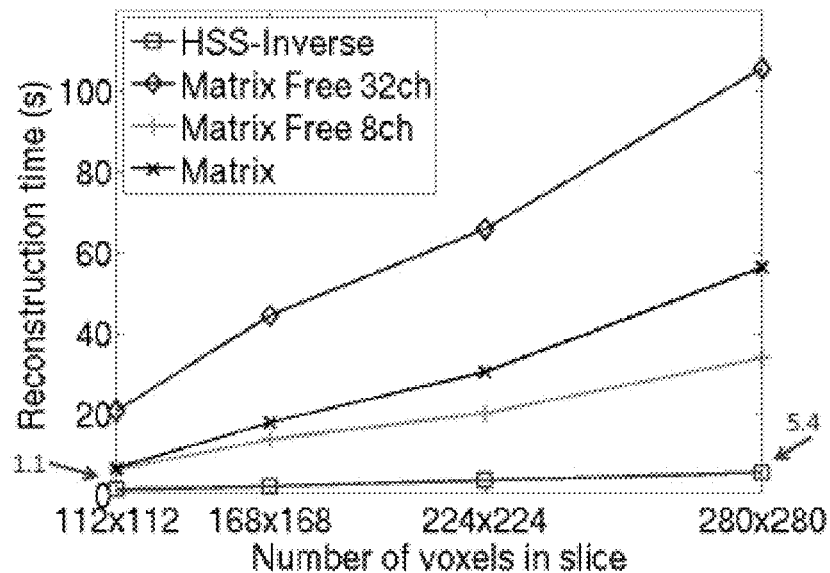
FIG. 2 is a plot illustrating an example of computational scaling with respect to image size for CG and HSS based reconstruction methods.

FIG. 2 illustrates an example of the computational scaling of several Split Bregman optimization techniques with respect to image size. The Matrix Free and Matrix methods rely on pre-conditioned CG to solve Eqn. (6), and the proposed HSS-Inverse method uses the HSS direct solver described above. To ensure consistent reconstruction error, all numerical approaches assumed a $10^{-6}$ tolerance for the solution. The times reported in FIG. 2 correspond to five iterations of Split Bregman with a TV weighting $\beta=3\cdot10^{-3}$ and soft-thresholding $\varepsilon=2\cdot10^{-1}$. The Jacobi pre-conditioner is used for all the CG methods. The use of Cartesian optimized coil compression from 32 to 8-channels is explored for the Matrix Free method. The HSS-Inverse method had times of 1.1 s and 5.4 s for in-plane resolutions of 2×2 mm² to 0:8×0:8 mm². With the use of 4× channel compression the Matrix Free method became the best performing alternative to HSS-Inverse.

Figure 3:
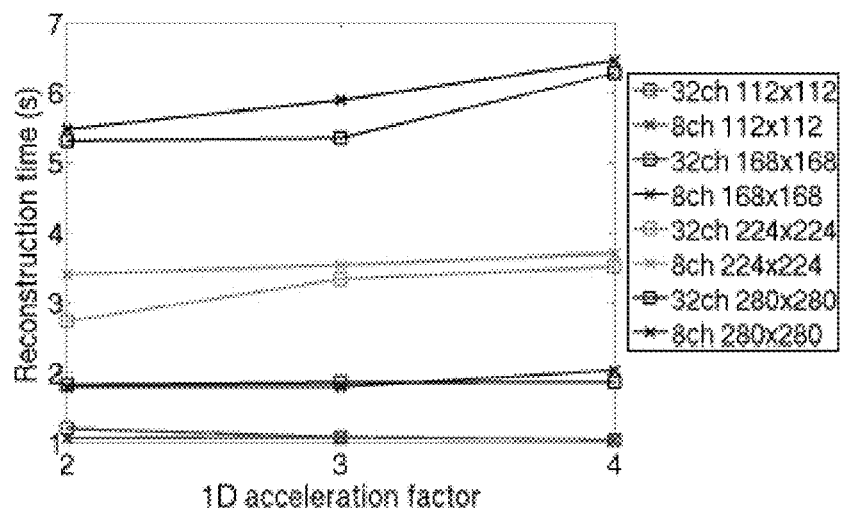
FIG. 3 is a plot illustrating an example of computational scaling of the HSS-Inverse method with respect to the number of parallel imaging channels and acceleration factor.

FIG. 3 illustrates the lack of dependence of the HSS-Inverse method on the number of parallel imaging channels and acceleration factor. Here, reconstruction parameters consistent with the results shown in FIG. 2 were used. R=2, 3, and 4 accelerations were examined across in-plane resolutions from 2×2 mm² to 0:8×0:8 mm². The deviation in reconstruction time for HSS-Inverse was under 0.7 s for all cases considered. This small deviation in time can be considered a constant based upon the numerical conditioning of the matrix, A.

It is important to note that the Matrix Free methods compared in FIGS. 2 and 3 utilize highly optimized FFT code and by re-implementing the MATLAB code used to implement the HSS-Inverse method in FIGS. 2 and 3 into a lower level programming language, it is expected that further improvements in the speed-up times can be achieved.

Thus, an efficient CS reconstruction strategy for MRI assuming SENSE parallel imaging has been described. The proposed HSS-Inverse method exploits the fact that the Split Bregman framework produces a series of least squares problems with a fixed reconstruction operator.

The proposed HSS-Inverse method demonstrates minimal computational dependency with respect to both the acceleration factor and the number of parallel imaging channels. Given the dependence of the CG-based Matrix Free method on channel count, it is contemplated that the speed-up of the HSS-Inverse method will increase when considering larger array coils as additional compressed channels will be required for similar accuracy.

As was alluded to above, the efficiency of HSS-Inverse does not substantially change as the CS acceleration factor is increased, which will allow for consistent reconstruction times regardless of the protocol. In addition, the HSS solver is non-iterative and the computational time should not be significantly affected by choice of CS penalty parameters. In the context of pre-specified MRI acquisition protocols, many factors for the HSS-Inverse method can be pre-computed and should enable clinically relevant reconstruction times (e.g., the computation of the inverse encoding matrix can be computed as part of a separate adjustment scan).

The idea of compact representations for the inverse of CS+SENSE reconstruction operators has been described above. This is accomplished through the use of a non-iterative HSS numerical technique. It is contemplated that the methods described here will be applicable to many reconstruction operators that rely on locality of interactions (e.g., wavelet transformations and GRAPPA-based parallel imaging).

Finally, the proposed HSS-Inverse method should be amenable to computationally demanding applications, such as cardiac imaging, and magnetic resonance fingerprinting ("MRF"), where the problem size can become very large due to the additional time dimension.

Figure 4:
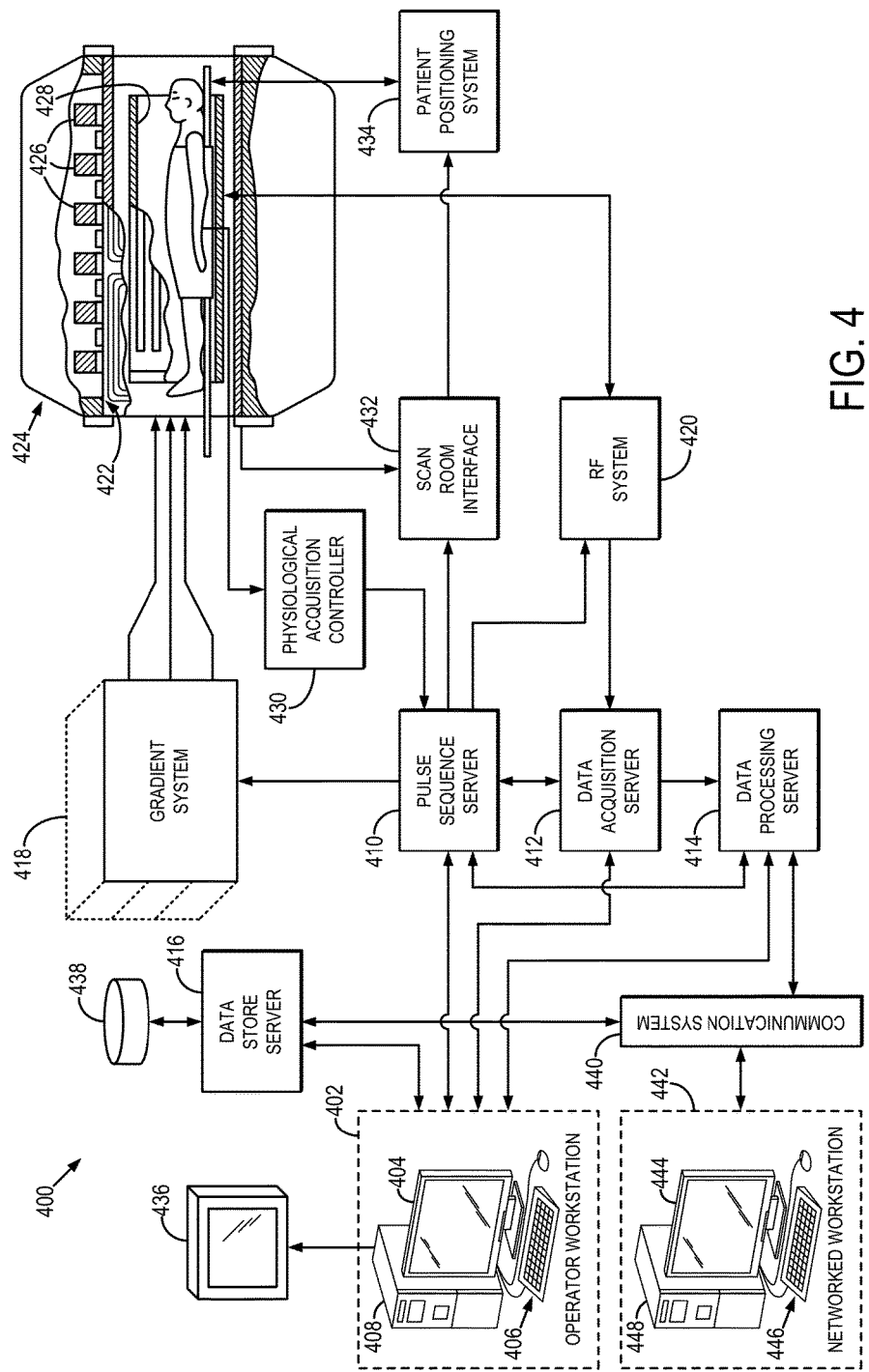
FIG. 4 is a block diagram of an example of a magnetic resonance imaging ("MRI") system.

Referring particularly now to FIG. 4, an example of a magnetic resonance imaging ("MRI") system 400 is illustrated. The MRI system 400 includes an operator workstation 402, which will typically include a display 404; one or more input devices 406, such as a keyboard and mouse; and a processor 408. The processor 408 may include a commercially available programmable machine running a commercially available operating system. The operator workstation 402 provides the operator interface that enables scan prescriptions to be entered into the MRI system 400. In general, the operator workstation 402 may be coupled to four servers:

a pulse sequence server 410; a data acquisition server 412; a data processing server 414; and a data store server 416. The operator workstation 402 and each server 410, 412, 414, and 416 are connected to communicate with each other. For example, the servers 410, 412, 414, and 416 may be connected via a communication system 440, which may include any suitable network connection, whether wired, wireless, or a combination of both. As an example, the communication system 440 may include both proprietary or dedicated networks, as well as open networks, such as the internet.

The pulse sequence server 410 functions in response to instructions downloaded from the operator workstation 402 to operate a gradient system 418 and a radiofrequency ("RF") system 420. Gradient waveforms necessary to perform the prescribed scan are produced and applied to the gradient system 418, which excites gradient coils in an assembly 422 to produce the magnetic field gradients $G_x$, $G_y$, and $G_z$ used for position encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil (not shown in FIG. 4), in order to perform the prescribed magnetic resonance pulse sequence. Responsive magnetic resonance signals detected by the RF coil 428, or a separate local coil (not shown in FIG. 4), are received by the RF system 420, where they are amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the scan prescription and direction from the pulse sequence server 410 to produce RF pulses of the desired frequency, phase, and pulse amplitude waveform. The generated RF pulses may be applied to the whole-body RF coil 428 or to one or more local coils or coil arrays (not shown in FIG. 4).

The RF system 420 also includes one or more RF receiver channels. Each RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (9);$$

and the phase of the received magnetic resonance signal may also be determined according to the following relationship:

$$\varphi = \tan^{-1}\left(\frac{Q}{I}\right). \qquad (10)$$

The pulse sequence server 410 also optionally receives patient data from a physiological acquisition controller 430. By way of example, the physiological acquisition controller 430 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 410 to synchronize, or "gate," the performance of the scan with the subject's heart beat or respiration.

The pulse sequence server 410 also connects to a scan room interface circuit 432 that receives signals from various sensors associated with the condition of the patient and the magnet system. It is also through the scan room interface circuit 432 that a patient positioning system 434 receives commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, such that no data is lost by data overrun. In some scans, the data acquisition server 412 does little more than pass the acquired magnetic resonance data to the data processor server 414. However, in scans that require information derived from acquired magnetic resonance data to control the further performance of the scan, the data acquisition server 412 is programmed to produce such information and convey it to the pulse sequence server 410. For example, during prescans, magnetic resonance data is acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also be employed to process magnetic resonance signals used to detect the arrival of a contrast agent in a magnetic resonance angiography ("MRA") scan. By way of example, the data acquisition server 412 acquires magnetic resonance data and processes it in real-time to produce information that is used to control the scan.

The data processing server 414 receives magnetic resonance data from the data acquisition server 412 and processes it in accordance with instructions downloaded from the operator workstation 402. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 414 are conveyed back to the operator workstation 402 where they are stored. Real-time images are stored in a data base memory cache (not shown in FIG. 4), from which they may be output to operator display 412 or a display 436 that is located near the magnet assembly 424 for use by attending physicians. Batch mode images or selected real time images are stored in a host database on disc storage 438. When such images have been reconstructed and transferred to storage, the data processing server 414 notifies the data store server 416 on the operator workstation 402. The operator workstation 402 may be used by an operator to archive the images, produce films, or send the images via a network to other facilities.

The MRI system 400 may also include one or more networked workstations 442. By way of example, a networked workstation 442 may include a display 444; one or more input devices 446, such as a keyboard and mouse; and a processor 448. The networked workstation 442 may be located within the same facility as the operator workstation 402, or in a different facility, such as a different healthcare institution or clinic.

The networked workstation 442, whether within the same facility or in a different facility as the operator workstation 402, may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may exchanged between the data processing server 414 or the data store server 416 and the networked workstations 442, such that the data or images may be remotely processed by a networked workstation 442. This data may be exchanged in any suitable format, such as in accordance with the transmission control protocol ("TCP"), the internet protocol ("IP"), or other known or suitable protocols.

Figure 5:
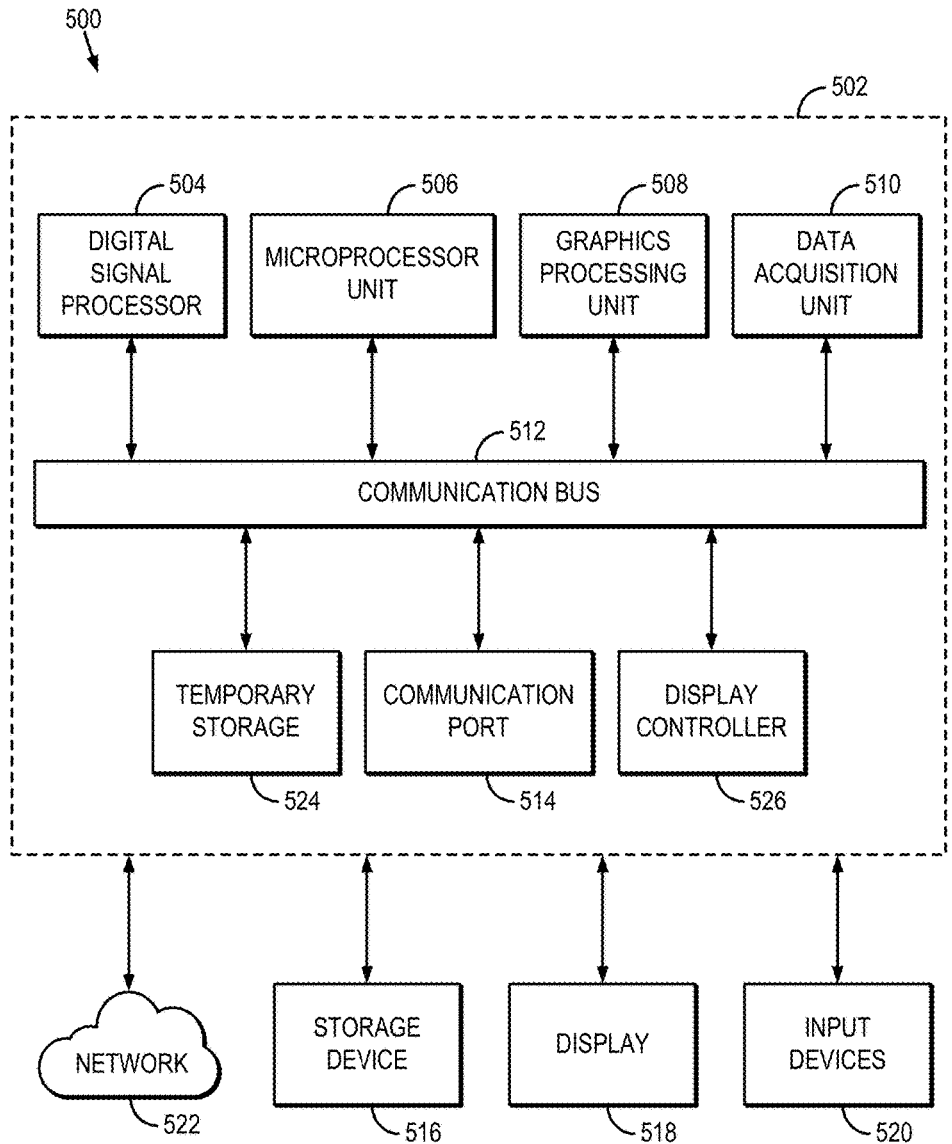
FIG. 5 is a block diagram of an example computer system that can be configured to implement the methods described herein.

Referring now to FIG. 5, a block diagram of an example computer system 500 that can be configured to reconstruct magnetic resonance images using a hierarchically semiseparable ("HSS") solver, as described above, is illustrated. The data from which the magnetic resonance images are reconstructed can be provided to the computer system 500 from the respective MRI system and received in a processing unit 502.

In some embodiments, the processing unit 502 can include one or more processors. As an example, the processing unit 502 may include one or more of a digital signal processor ("DSP") 504, a microprocessor unit ("MPU") 506, and a graphics processing unit ("GPU") 508. The processing unit 502 can also include a data acquisition unit 510 that is configured to electronically receive data to be processed, which may include magnetic resonance image data. The DSP 504, MPU 506, GPU 508, and data acquisition unit 510 are all coupled to a communication bus 512. As an example, the communication bus 512 can be a group of wires, or a hardwire used for switching data between the peripherals or between any component in the processing unit 502.

The DSP 504 can be configured to receive and processes the magnetic resonance data or reconstructed magnetic resonance images. The MPU 506 and GPU 508 can also be configured to process the magnetic resonance data or reconstructed magnetic resonance images in conjunction with the DSP 504. As an example, the MPU 506 can be configured to control the operation of components in the processing unit 502 and can include instructions to perform reconstruction of the magnetic resonance image data on the DSP 504. Also as an example, the GPU 508 can process image graphics.

In some embodiments, the DSP 504 can be configured to process the magnetic resonance image data received by the processing unit 502 in accordance with the algorithms described above. Thus, the DSP 504 can be configured to reconstruct magnetic resonance images using an HSS solver as described above.

The processing unit 502 preferably includes a communication port 514 in electronic communication with other devices, which may include a storage device 516, a display 518, and one or more input devices 520. Examples of an input device 520 include, but are not limited to, a keyboard, a mouse, and a touch screen through which a user can provide an input.

The storage device 516 is configured to store images, whether provided to or processed by the processing unit 502. The display 518 is used to display images, such as images that may be stored in the storage device 516, and other information. Thus, in some embodiments, the storage device 516 and the display 518 can be used for displaying reconstructed magnetic resonance images.

The processing unit 502 can also be in electronic communication with a network 522 to transmit and receive data, including CT images, MR images, and other information. The communication port 514 can also be coupled to the processing unit 502 through a switched central resource, for example the communication bus 512.

The processing unit 502 can also include a temporary storage 524 and a display controller 526. As an example, the temporary storage 524 can store temporary information. For instance, the temporary storage 524 can be a random access memory.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing an image of a subject from data acquired using a magnetic resonance imaging (MRI) system, the steps of the method comprising:
    (a) providing data acquired from a subject using an MRI system;
    (b) computing an inverse of an encoding matrix using a hierarchically semiseparable solver;
    (c) reconstructing an image of the subject from the provided data using the computed inverse of the encoding matrix.

2. The method as recited in claim 1, wherein step (b) includes computing the inverse of the encoding matrix by performing a structured factorization of the encoding matrix.

3. The method as recited in claim 2, wherein the factorization can be represented using low-rank modeling.

4. The method as recited in claim 1, wherein the encoding matrix is based on a Split Bregman reconstruction.

5. The method as recited in claim 4, wherein the encoding matrix includes a penalty term based on a total variation sparsity.

6. The method as recited in claim 5, wherein the penalty term relaxes an $L_1$ norm by solving for $L_2$ targets.

7. The method as recited in claim 6, wherein the $L_2$ targets include vertical and horizontal finite difference targets.

8. The method as recited in claim 6, wherein the targets are updated using a soft-thresholding technique.

9. The method as recited in claim 1, wherein step (b) includes non-iteratively computing the inverse of the encoding matrix.

* * * * *